(12) United States Patent
Chung et al.

(10) Patent No.: US 10,810,080 B2
(45) Date of Patent: *Oct. 20, 2020

(54) MEMORY DEVICE SELECTIVELY CORRECTING AN ERROR IN DATA DURING A READ OPERATION, MEMORY SYSTEM INCLUDING THE SAME, AND OPERATING METHOD OF MEMORY SYSTEM

(71) Applicant: SK hynix Inc., Gyeonggi-do (KR)

(72) Inventors: Hoiju Chung, San Jose, CA (US); Young-Do Hur, Chungcheongbuk-do (KR); Hyuk Lee, Gyeonggi-do (KR); Jang-Ryul Kim, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 115 days.

This patent is subject to a terminal disclaimer.

(21) Appl. No.: 16/027,826

(22) Filed: Jul. 5, 2018

(65) Prior Publication Data
US 2019/0012231 A1    Jan. 10, 2019

Related U.S. Application Data

(60) Provisional application No. 62/528,849, filed on Jul. 5, 2017, provisional application No. 62/644,116, filed on Mar. 16, 2018.

(51) Int. Cl.
*G06F 11/10* (2006.01)
*G06F 3/06* (2006.01)
(Continued)

(52) U.S. Cl.
CPC ........ *G06F 11/1068* (2013.01); *G06F 3/0619* (2013.01); *G06F 3/0659* (2013.01);
(Continued)

(58) Field of Classification Search
None
See application file for complete search history.

(56) References Cited

U.S. PATENT DOCUMENTS

| 6,898,036 | B2 | 5/2005 | Gill et al. |
| 10,204,008 | B2 * | 2/2019 | Trezise ........... G11C 5/04 |

(Continued)

FOREIGN PATENT DOCUMENTS

KR    1020160021556    2/2016

OTHER PUBLICATIONS

Office Action issued by the USPTO for U.S. Appl. No. 16/027,767 dated Jul. 23, 2020.

*Primary Examiner* — Justin R Knapp
(74) *Attorney, Agent, or Firm* — IP & T Group LLP

(57) ABSTRACT

A memory system includes an error correction code ("ECC") generation circuit using write data to generate an ECC to be stored together with the write data; a memory device, during a write operation, storing received data and a received ECC in a memory core, and, during a read operation, checking for an error in data read from the memory core, correcting the error in read data using the ECC and outputting error-corrected data and the ECC, when the error in the read data is between one bit and N bits inclusive, and outputting the read data and the ECC when no error is present in the read data or the error in the read data exceeds N bits; and an error correction circuit correcting, when an error is present in data outputted from the memory device, the error in the data outputted using an ECC outputted from the memory device.

10 Claims, 9 Drawing Sheets

(51) Int. Cl.
  *G11C 29/52* (2006.01)
  *H03M 13/00* (2006.01)
  *G11C 29/04* (2006.01)

(52) U.S. Cl.
  CPC ........ *G06F 3/0673* (2013.01); *G06F 11/1004* (2013.01); *G06F 11/1048* (2013.01); *G11C 29/52* (2013.01); *G11C 2029/0411* (2013.01)

(56) References Cited

U.S. PATENT DOCUMENTS

| | | | |
|---|---|---|---|
| 10,417,091 B2* | 9/2019 | Lesartre | G06F 3/0619 |
| 2010/0005366 A1* | 1/2010 | Dell | G06F 11/073 |
| | | | 714/758 |
| 2011/0231737 A1* | 9/2011 | Dachiku | G06F 11/1044 |
| | | | 714/770 |
| 2012/0266041 A1* | 10/2012 | Wang | G06F 11/10 |
| | | | 714/752 |
| 2015/0378823 A1* | 12/2015 | Lesartre | G06F 11/1048 |
| | | | 714/764 |
| 2018/0024897 A1 | 1/2018 | Cai et al. | |

* cited by examiner

MEMORY DEVICE SELECTIVELY CORRECTING AN ERROR IN DATA DURING A READ OPERATION, MEMORY SYSTEM INCLUDING THE SAME, AND OPERATING METHOD OF MEMORY SYSTEM

CROSS-REFERENCE TO RELATED APPLICATIONS

This application the benefit of U.S. Provisional Application No. 62/528,849, filed on Jul. 5, 2017, and U.S. Provisional Application No. 62/644,116, filed on Mar. 16, 2018, the entire contents of which are incorporated herein by reference.

BACKGROUND

1. Field

Various embodiments of the present invention relate to a memory device and a memory system including the same, and a method of operating a memory system.

2. Discussion of the Related Art

In the past, the semiconductor memory industry was able to regularly produce a number of original good dies, each of which having no failed memory cell, on a wafer by a semiconductor fabrication process. The original good dies may be recognized when inspected after the semiconductor fabrication process. However, as the density of a memory device has gradually increased, it has become substantially more difficult to fabricate a memory device which has no failed memory cell, and presently, it may be unlikely that such an ergo free memory device can be fabricated. One way to overcome this situation is to repair failed memory cells of a memory device using redundant memory cells.

Another way is to correct an error in a memory cell and another error that occurred while data is transmitted in the read and write processes of a memory system using an error correction circuit (ECC circuit).

SUMMARY

Various embodiments are directed to providing a technology capable of enhancing or improving error correction efficiency in a memory system.

In an embodiment, a memory system may include: an error correction code generation circuit suitable for using write data to generate an error correction code to be stored together with the write data; a memory device suitable for, during a write operation, storing received data and a received error correction code in a memory core, and, during a read operation, checking for an error in data read from the memory core, correcting the error in read data using the error correction code and outputting error-corrected data and the error correction code, when the error in the read data is between one bit and N bits inclusive, where N is an integer of 1 or more, and outputting the read data and the error correction code when no error is present in the read data or the error in the read data exceeds N bits; and an error correction circuit suitable for correcting, when an error is present in data outputted from the memory device, the error in the data outputted using an error correction code outputted from the memory device.

In an embodiment, a method for operating a memory system may include: generating, by a memory controller, using write data, an error correction code; transferring a write command, the write data, and the error correction code to a memory device from the memory controller; storing the write data and the error correction code in a memory core of the memory device; transferring a read command from the memory controller to the memory device; reading data and an error correction code from the memory core of the memory device; detecting, by the memory device, an error in the data read from the memory core using the error correction code read from the memory core; correcting, by the memory device, when the error in the read data is between one bit and N bits inclusive, where N is an integer of 1 or more, the error in the read data using the read error correction code, and transferring error-corrected data and the read error correction code to the memory controller from the memory device; transferring, when no error is present in the read data or the error in the read data exceeds N bits, the read data and the read error correction code to the memory controller from the memory device; and correcting, by the memory controller, when an error is present in the data transferred from the memory device, the error in the data outputted using the error correction code transferred from the memory device.

In an embodiment, a memory device may include: a data transmission and reception circuit suitable for transmitting and receiving data and an error correction code; a memory core suitable for storing data and an error correction code received through the data transmission and reception circuit; and an in-memory error correction circuit suitable for, during a read operation, checking for an error in data read from the memory core using an error correction code read from the memory core, and correcting the error of the read data using the read error correction code when the error in the read data is between one bit and N bits inclusive, where N is an integer of 1 or more.

In an embodiment, a memory system may include: a memory controller suitable for, during a write operation, generating an error correction code for correcting an error in data and transferring the error correction code to a memory device, and, during a read operation, correcting an error in data transferred from the memory device using an error correction code transferred from the memory device; and the memory device suitable for, during the write operation, storing data and an error correction code transferred from the memory controller as they are, and, during the read operation, transferring read data and a read error correction code to the memory controller and, when a specific condition is satisfied, correcting an error in the read data using the read error correction code and transferring error-corrected data and the read error correction code to the memory controller.

DETAILED DESCRIPTION

Figure 1:
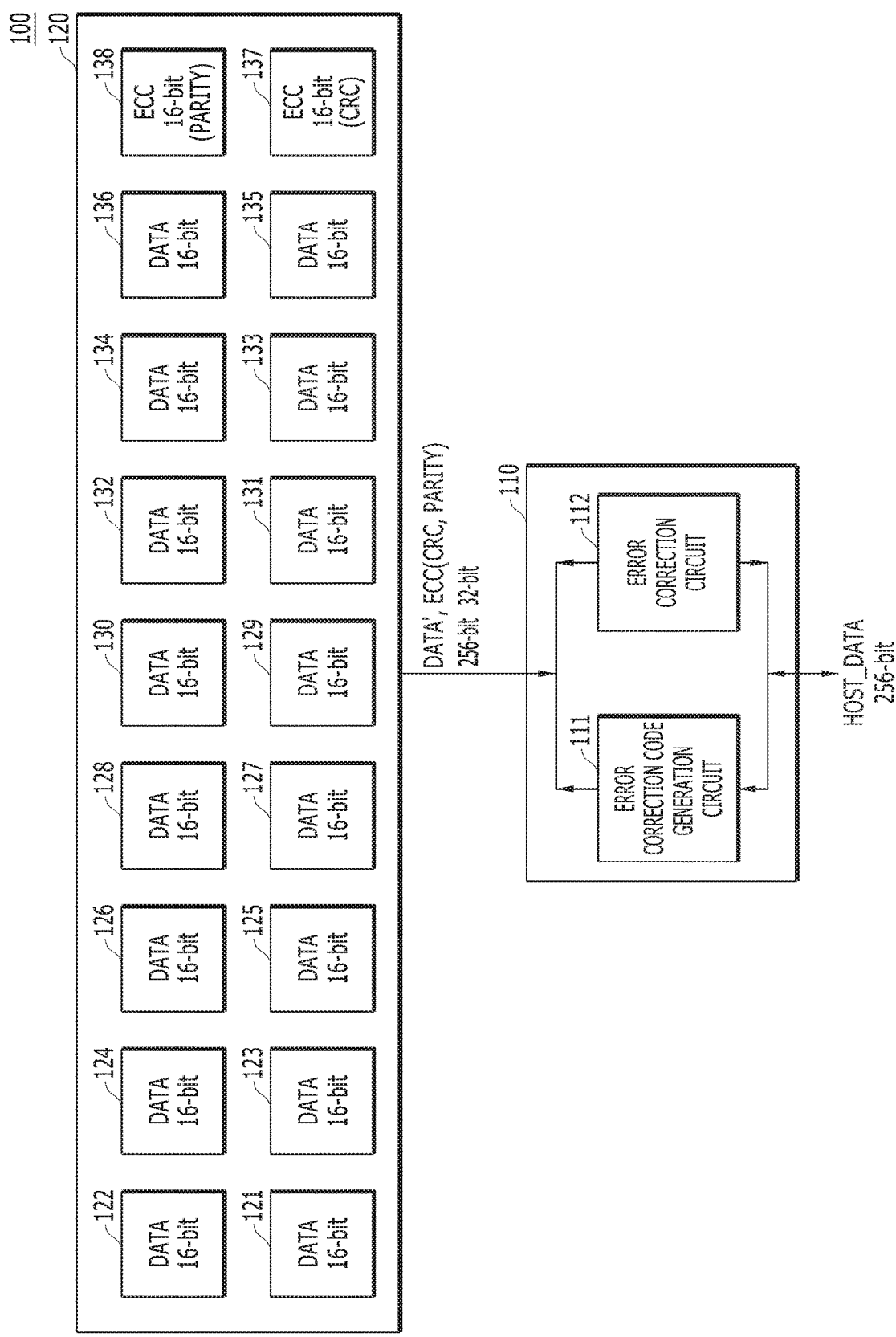
FIG. 1 is a diagram illustrating a configuration of a memory system 100 in accordance with an embodiment.

Various embodiments will be described below in more detail with reference to the accompanying drawings. The present invention may, however, be embodied in different forms and thus is not limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention. Also, throughout the disclosure, reference to "an embodiment" or the like is not necessarily to only one embodiment, and different references to "an embodiment" or the like are not necessarily to the same embodiment(s).

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a diagram illustrating a configuration of a memory system 100 in accordance with an embodiment. In FIG. 1, only components directly associated with storage of data and error correction of data in the memory system 100 are shown.

Referring to FIG. 1, the memory system 100 may include a memory controller 110 and a memory module 120.

The memory controller 110 may control the read and write operations of the memory module 120 depending on, and in response to, a request of a host. The memory controller 110 may include an error correction code generation circuit 111 for generating an error correction code ECC in the write operation and an error correction circuit 112 for correcting an error of data DATA by using the error correction code ECC in the read operation.

The error correction code generation circuit 111 may generate the error correction code ECC for correcting an error, by using data HOST_DATA transferred from the host, in the write operation. By way of example, the unit of data, that is, unit of data word, to be processed in a single write operation is 256 bits. In this case, the error correction code generation circuit 111 may generate the error correction code ECC of 32 bits by using the data HOST_DATA of 256 bits. In the error correction code ECC, 16 bits may be a CRC (cyclic redundancy check) code for the data HOST_DATA of 256 bits, and the remaining 16 bits may be a simple parity code against the data HOST_DATA of 256 bits and the CRC code of 16 bits. In the write operation, since the error correction code ECC is generated but an error correction operation is not performed, the data HOST_DATA transferred from the host and the data DATA transferred from the memory controller 110 to the memory module 120 may be the same. A codeword may represent both the data DATA and the error correction code ECC. The codeword of 288 bits may be divided into 18 symbols. When one symbol is 16 bits, the data DATA of 256 bits may be divided into 16 symbols. The error correction code ECC of 32 bits may be divided into the CRC code of one symbol and the simple parity code of one symbol. The CRC code may be, concretely, a CRC-16 code. The simple parity code may be generated through a logical XOR operation, i.e., XORing, by unit of symbol, the remaining symbols except the simple parity code in the entire codeword.

The error correction circuit 112 may cure or correct an error of the data DATA transferred from the memory module 120, by using the error correction code ECC transferred from the memory module 120, in the read operation. The error correction circuit 112 may correct an error of the data DATA in a manner of detecting the error by using the CRC code and restoring a symbol by using the simple parity code. An error correction operation may be repeated until an error is not detected. By way of example, when the presence of an error is detected through a CRC calculation using the CRC code, a first symbol may be restored through a parity calculation using the parity code, in which case it is assumed that an error is present in the first symbol. When an error is detected through a CRC calculation using the CRC code with the first symbol restored, a second symbol is restored through a parity calculation using the parity code, in which case it is assumed that an error is present in the second symbol. When an error is detected through a CRC calculation using the CRC code with the second symbol restored, a third symbol is restored through a parity calculation using the parity code, in which case it is assumed that an error is present in the third symbol. When an error is detected through a CRC calculation using the CRC code with the third symbol restored, a fourth symbol is restored through a parity calculation using the parity code, in which case it is assumed that an error is present in the fourth symbol. These operations may be repeated until an error is not detected. In this way, the error correction circuit 112 may correct or cure an error of one symbol.

The memory module 120 may include 18 memory devices 121 to 138. Each of the memory devices 121 to 138 may be one of all kinds of memories such as a DRAM (dynamic random access memory), a PCRAM (phase change random access memory) and a flash memory. The memory module 120 may be a DIMM (dual in-line memory module) type. Portions of the codeword of 288 bits may be stored in all 18 memory devices 121 to 138. The codeword of 288 bits may include the data DATA of 256 bits and the error correction code ECC of 32 bits, that is, the codeword of 18 symbols. The 18 symbols configuring the codeword may be written, one symbol by one symbol, in the 18 memory devices 121 to 138, respectively, during a single write operation. The total 18 symbols may be read, one symbol by one symbol, from the 18 memory devices 121 to 138, respectively, during a single read operation. In each of the memory devices 121 to 138, the codeword which is stored by a corresponding memory device is shown. For example, the memory device 123 may store one data symbol of 16 bits, and another memory device 137 may store one ECC symbol of 16 bits (the CRC code of the error correction code ECC).

Figure 2:
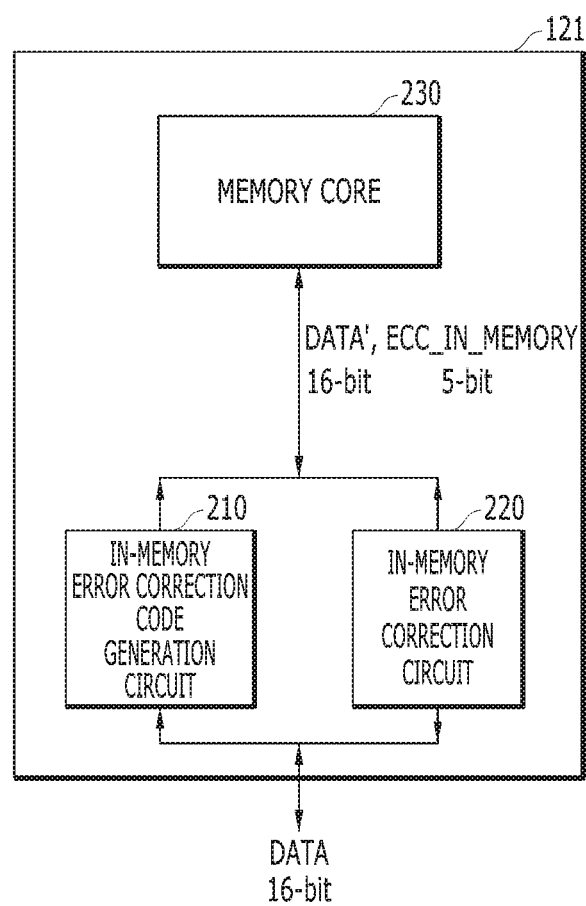
FIG. 2 is a diagram illustrating a configuration of the memory device 121 shown in FIG. 1.

FIG. 2 is a diagram illustrating a configuration of the memory device 121 shown in FIG. 1. In FIG. 2, only components directly associated with storage of data and error correction of data in the memory device 121 are shown for clarity. The other memory devices 122 to 138 of FIG. 1 may be configured as shown in FIG. 2.

Referring to FIG. 2, the memory device 121 may include an in-memory error correction code generation circuit 210, an in-memory error correction circuit 220 and a memory core 230.

The in-memory error correction code generation circuit 210 may generate an in-memory error correction code ECC_IN_MEMORY for correcting an error, by using the data DATA received by the memory device 121. For example, the in-memory error correction code generation circuit 210 may use the data DATA of 16 bits to generate the in-memory error correction code ECC_IN_MEMORY of five bits, which is used for correcting an error of the data DATA. The in-memory error correction code ECC_IN_MEMORY may include a Hamming code. In the write operation, since the error correction operation is not performed, the data DATA received by the memory device 121 and data DATA' transferred to the memory core 230 may be the same.

The memory core 230 may store the data DATA' and the in-memory error correction code ECC_IN_MEMORY in the memory device 121. The memory core 230 may include a plurality of cell arrays and circuits for writing the data DATA' and the in-memory error correction code ECC_IN_MEMORY in the plurality of cell arrays and reading the data DATA' and the in-memory error correction code ECC_IN_MEMORY from the plurality of cell arrays. In the write operation, the data DATA' received by the memory device 121 and the in-memory error correction code ECC_IN_MEMORY generated in the in-memory error correction code generation circuit 210 may be written in the memory core 230. In the read operation, the data DATA' and the in-memory error correction code ECC_IN_MEMORY may be read from the memory core 230.

The in-memory error correction circuit 220 may correct an error of the data DATA' read from the memory core 230, by using the in-memory error correction code ECC_IN_MEMORY read from the memory core 230. The data DATA in which an error is corrected by the in-memory error correction circuit 220 may be transmitted from the memory device 121 to the memory controller 110. The in-memory error correction circuit 220 may generally correct an error of one bit which has occurred in the memory device 121.

The circuits 210, 220 for in-memory error correction are to perform the error correction operation of the memory device 121 itself. The error correction operation may be performed in a state in which it is hidden to the memory controller 110. That is to say, the memory controller 110 may not be aware that the additional in-memory error correction code ECC_IN_MEMORY is stored in the memory device 121. Also, the memory controller 110 may not be aware that the in-memory error correction operation is performed internally of the memory device 121.

Since the error correction operation of the in-memory error correction circuit 220 should be performed within a short time, its error correction capability is relatively small. For example, the in-memory error correction circuit 220 may correct only an error of one bit. In the case where errors exceeding the error correction capability of the in-memory error correction circuit 220 occur, such errors may instead increase as a result of a malfunction. For example, in the case where errors of two bits occur, the in-memory error correction circuit 220 may not correct the errors and may increase errors to three bits.

Even when errors exceed the error correction capability of the in-memory error correction circuit 220 and thus increase by a malfunction, no problem may be caused in the operation of the memory system 100. Because the memory device 121 only stores one symbol of the entire codeword configured by 18 symbols, it is likely that errors exist in only one symbol in the entire codeword. Even when errors is increase as a result of the in-memory error correction circuit 220, the increased errors are present only in one symbol in the entire codeword and may be corrected by the error correction circuit 112 of the memory controller 110.

Figure 3:
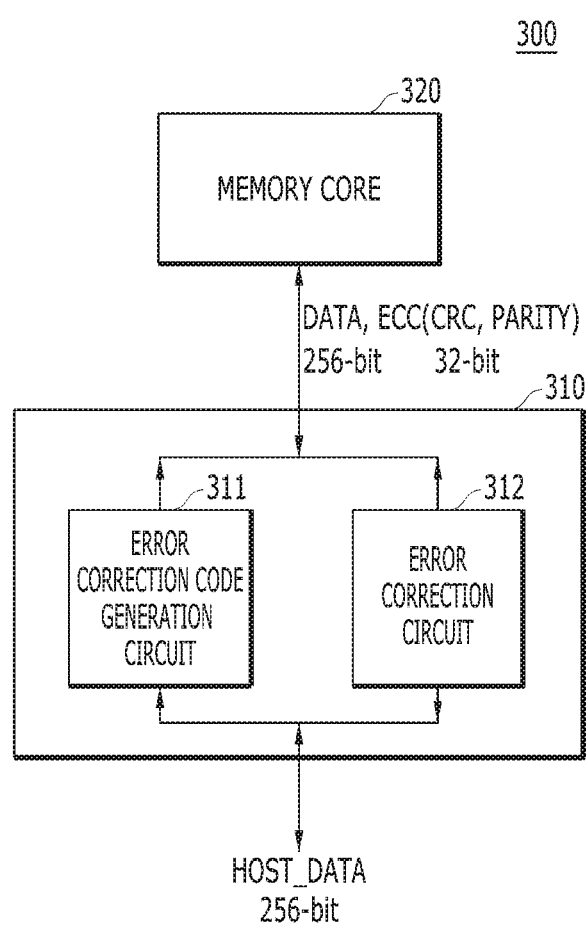
FIG. 3 is a diagram illustrating a configuration of a memory system 300 in accordance with another embodiment.

FIG. 3 is a diagram illustrating a configuration of a memory system 300 in accordance with another embodiment. In FIG. 3, only components directly associated with storage of data and error correction of data in the memory system 300 are shown.

Referring to FIG. 3, the memory system 300 may include a memory controller 310 and a memory device 320.

The memory controller 310 may control the read and write operations of the memory device 320 depending on a request of a host. The memory controller 310 may include an error correction code generation circuit 311 for generating an error correction code ECC in the write operation and an error correction circuit 312 for correcting an error of data DATA by using the error correction code ECC in the read operation.

The error correction code generation circuit 311 may generate the error correction code ECC for correcting an error, by using data HOST_DATA transferred from the host, in the write operation. It is illustrated as an example that unit of data, that is, unit of data word, to be processed in a single write operation is 256 bits. In this case, the error correction code generation circuit 311 may generate the error correction code ECC of 32 bits by using the data HOST_DATA of 256 bits. In the error correction code ECC, 16 bits may be a CRC (cyclic redundancy check) code for the data HOST_DATA of 256 bits, and the remaining 16 bits may be a simple parity code for the data HOST_DATA of 256 bits and the CRC code of 16 bits. In the write operation, since the error correction code ECC is generated but an error correction operation is not performed, the data HOST_DATA transferred from the host and the data DATA transferred from the memory controller 310 to the memory device 320 may be the same. A codeword may represent both the data DATA and the error correction code ECC. The codeword of 288 bits may be divided into 18 symbols. For example, when one symbol is 16 bits, the data DATA of 256 bits may be divided into 16 symbols. The error correction code ECC of 32 bits may be divided into the CRC code of one symbol and the simple parity code of one symbol. The CRC code may be a CRC-16 code. The simple parity code may be generated through a logical XOR operation, i.e., XORing, by unit of symbol, the remaining symbols except the simple parity code in the entire codeword.

The error correction circuit 312 may cure or correct an error of the data DATA transferred from the memory device 320, by using the error correction code ECC transferred from the memory device 320, in the read operation. The error correction circuit 312 may correct an error of the data DATA in a manner of detecting the error by using the CRC code and restoring a symbol by using the simple parity code. Operations that may be performed and repeated until an error is not detected include an operation in which the presence of an error is detected through a CRC calculation using the CRC code and a first symbol is restored through a parity calculation using the parity code when it is assumed that an error is present in the first symbol, an operation in which the presence of an error is detected through a CRC calculation using the CRC code with the first symbol restored and a second symbol is restored through a parity calculation using the parity code when it is assumed that an error is present in the second symbol, an operation in which the presence of an error is detected through a CRC calculation using the CRC code with the second symbol restored and a third symbol is restored through a parity calculation using the parity code when it is assumed that an error is present in the third symbol and an operation in which the presence of an error is detected through a CRC calculation using the CRC code with the third symbol restored and a fourth symbol is restored through a parity calculation using the parity code when it is assumed that an error is present in the fourth symbol. In this way, the error correction circuit 312 may correct an error of one symbol.

The memory device 320 may store the entirety of the codeword of 288 bits including the data DATA and the error correction code ECC, that is, the codeword of 18 symbols. The entirety of the 18 symbols configuring the codeword may be stored in the memory device 320 in one write operation. The entirety of the 18 symbols may be read from the memory device 320 in one read operation. The memory device 320 may be a high bandwidth memory (HBM). In addition to having higher than usual bandwidth, the HBM has a higher than usual density. The HBM is configured in that memory chips are stacked based on a 3D-TSV technology and an increased number of data pins are disposed to increase I/O bandwidth. In the case of the HBM, an entire codeword corresponding to one write command may be written in one memory device in a write operation, and an entire codeword corresponding to one read command may be read from one memory device in a read operation. In the memory system 300 of FIG. 3, an entire codeword is written in one memory device 320 and an entire codeword is read from one memory device 320. Besides the HBM, other kinds of memories may be used as the memory device 320 of the memory system 300 so long as they satisfy such a condition.

Figure 4:
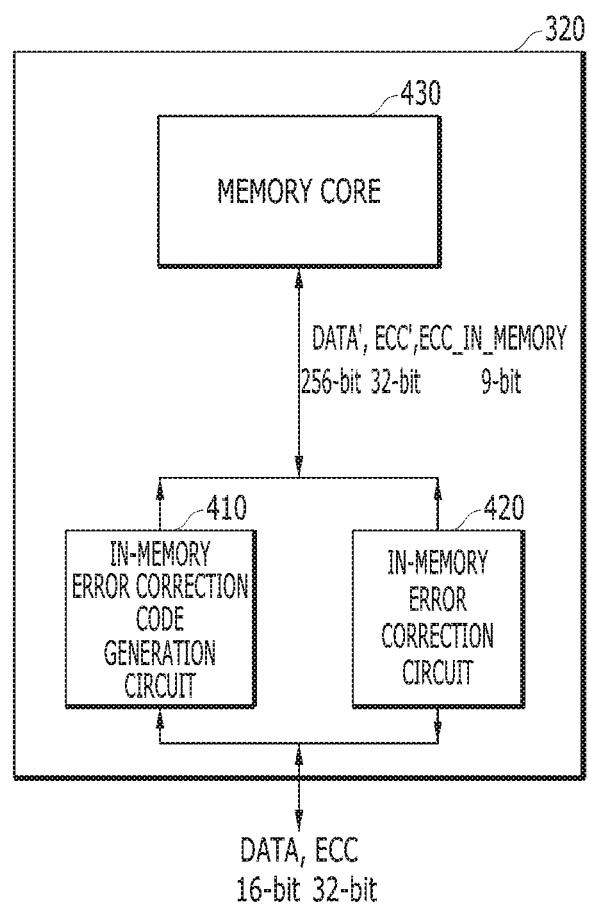
FIG. 4 is a diagram illustrating an example of the memory device 320 shown in FIG. 3.

FIG. 4 is a diagram illustrating a configuration of the memory device 320 shown in FIG. 3. In FIG. 4, only components directly associated with storage of data and error correction of data in the memory device 320 are shown.

Referring to FIG. 4, the memory device 320 may include an in-memory error correction code generation circuit 410, an in-memory error correction circuit 420 and a memory core 430.

The in-memory error correction code generation circuit 410 may generate an in-memory error correction code ECC_IN_MEMORY for correcting an error of the data DATA and the error correction code ECC, by using the data DATA and the error correction code ECC received by the memory device 320. For example, the in-memory error correction code generation circuit 410 may use the data DATA of 256 bits and the error correction code ECC of 32 bits, that is, a message of total 288 bits, to generate the in-memory error correction code ECC_IN_MEMORY of nine bits. The in-memory error correction code ECC_IN_MEMORY may include a Hamming code. In the write operation, since the error correction operation is not performed, the data DATA and the error correction code ECC received by the memory device 320 may be the same as data DATA' and an error correction code ECC' transferred to the memory core 430.

The memory core 430 may store the data DATA', the error correction code ECC' and the in-memory error correction code ECC_IN_MEMORY in the memory device 320. The memory core 430 may include a plurality of cell arrays and circuits for writing the data DATA', the error correction code ECC' and the in-memory error correction code ECC_IN_MEMORY in the plurality of cell arrays, and for reading the data DATA', the error correction code ECC' and the in-memory error correction code ECC_IN_MEMORY from the plurality of cell arrays.

The in-memory error correction circuit 420 may correct an error of the data DATA' and error correction code ECC' read from the memory core 430, by using the in-memory error correction code ECC_IN_MEMORY read from the memory core 430. The data DATA and error correction code ECC in which an error is corrected by the in-memory error correction circuit 420 may be transmitted from the memory device 320 to the memory controller 310. The in-memory error correction circuit 420 may correct an error of one bit which has occurred in the memory device 320.

The circuits 410, 420 for in-memory error correction are to perform the error correction operation of the memory device 320 itself. The error correction operation may be performed in a state in which it is hidden to the memory controller 310. That is to say, the memory controller 310 may not be aware that the additional in-memory error correction code ECC_IN_MEMORY is stored in the memory device 320, and may not be aware that the in-memory error correction operation is performed internally of the memory device 320.

Since the error correction operation of the in-memory error correction circuit 420 should be performed within a short time, its error correction capability may be relatively small. For example, the in-memory error correction circuit 420 may correct only an error of one bit. In the case where errors exceeding the error correction capability of the in-memory error correction circuit 420 occur, such errors may instead increase by a malfunction. For example, in the case where errors of two bits occur, the in-memory error correction circuit 420 may not correct the errors and may increase errors to three bits.

Unlike the memory system 200 of FIGS. 1 and 2, in the memory system 300 of FIGS. 3 and 4, the malfunction of the in-memory error correction circuit 420 may cause a problem, as described below with reference to FIGS. 5A and 5B.

Figure 5A:
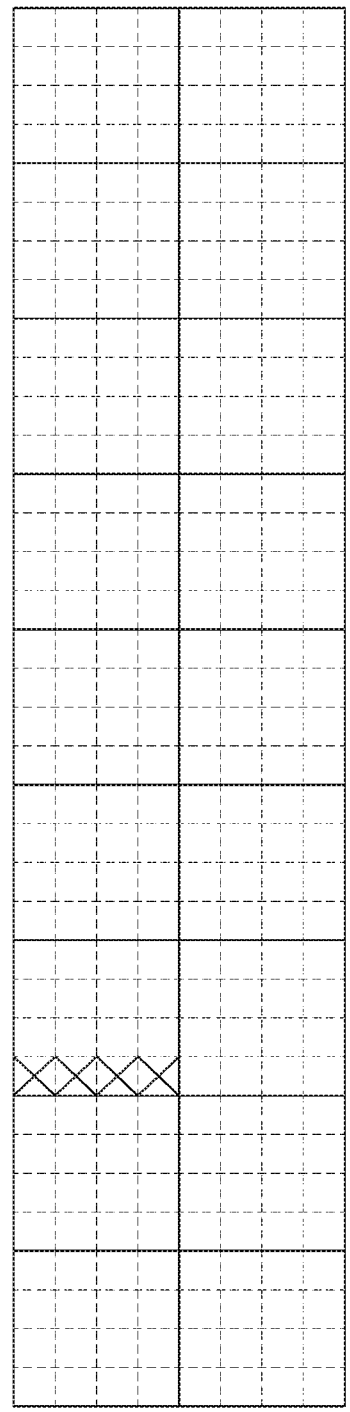
FIGS. 5A and 5B are diagrams describing an operation of an in-memory error correction circuit 420.

FIG. 5A shows the data DATA' and error correction code ECC' of 288 bits read from the memory core 430 of the memory device 320 of the memory system 300. The 18 sections partitioned by solid lines may represent 18 symbols respectively, and the 16 subsections partitioned by dotted lines in each of the symbols represent data of 16 bits in a corresponding symbol, each of the subsections representing one bit. The four bits denoted by X in the drawing may represent error bits. Referring to FIG. 5A, it may be seen that errors of four bits are included in one symbol.

Figure 5B:
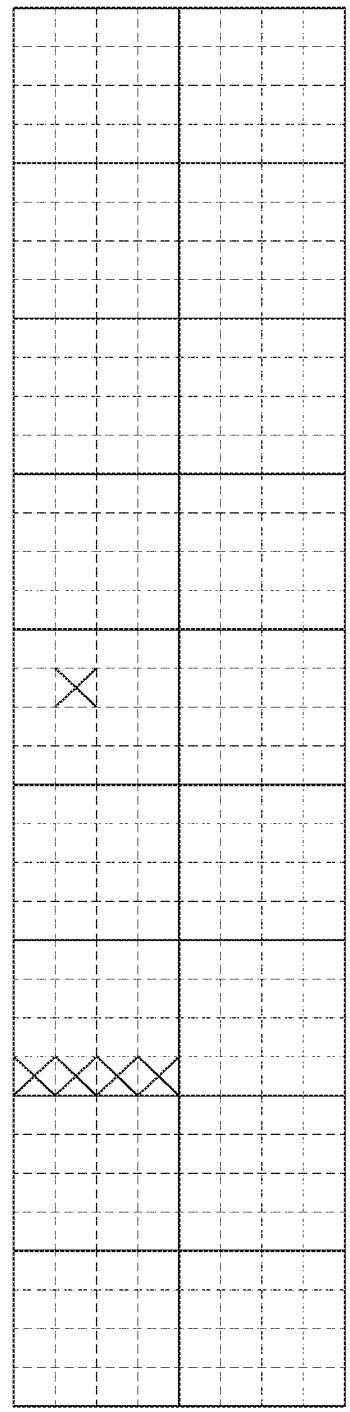

FIG. 5B shows the data DATA and the error correction code ECC after the in-memory error correction circuit 420 performs the error correction operation for the data DATA' and the error correction code ECC' by using the in-memory error correction code ECC_IN_MEMORY. Since the number of the errors exceeds the error-correctable bit number of the in-memory error correction circuit 420, an error of one bit is increased by the error correction operation of the in-memory error correction circuit 420. It may be seen from FIG. 5B that the errors of four bits are included in the same symbol as in FIG. 5A and another error of one bit is included in another symbol due to the malfunction of the in-memory error correction circuit 420.

The error correction operation of the in-memory error correction circuit 420 may cause an error in the operation of the memory system 300. In FIG. 5A, since the errors are in one symbol, the errors may be corrected by the error correction operation of the error correction circuit 312. However, in FIG. 5B, since the errors are two symbols, the errors cannot be corrected even by the error correction operation of the error correction circuit 312. In other words, due to the error correction operation of the in-memory error correction circuit 420, it is no longer possible to correct, even by the error correction circuit 312, errors which may otherwise be corrected when there is no error correction operation of the in-memory error correction circuit 420.

Figure 6:
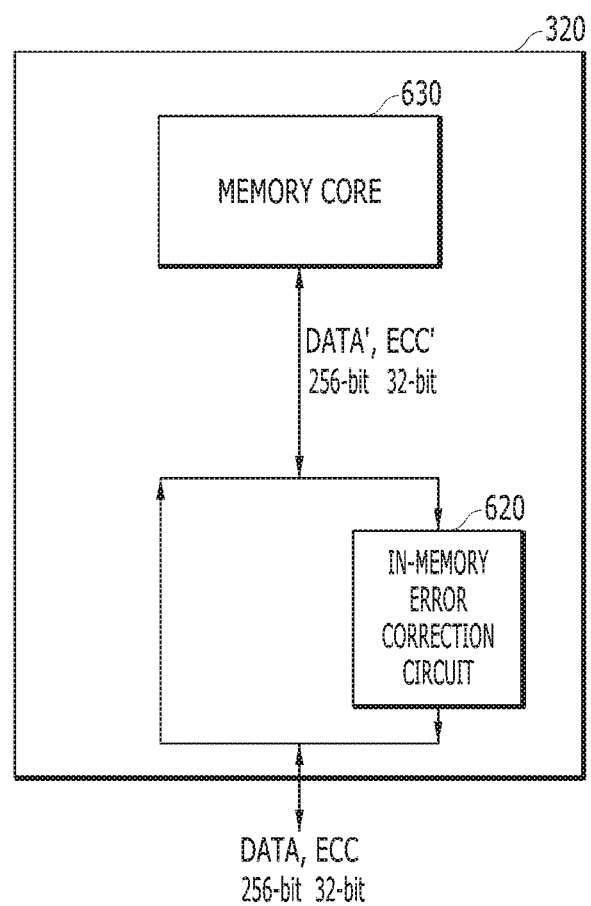
FIG. 6 is a diagram illustrating a configuration of the memory device 320 shown in FIG. 3.

FIG. 6 is a diagram illustrating a configuration of the memory device 320 shown in FIG. 3. In FIG. 6, only components directly associated with storage of data and error correction of data in the memory device 320 are shown.

Referring to FIG. 6, the memory device 320 may include an in-memory error correction circuit 620 and a memory core 630.

The memory device 320 of FIG. 6 does not include an in-memory error correction code generation circuit unlike the memory device 320 FIG. 3. Therefore, in this embodiment, an in-memory error correction code ECC_IN_MEMORY does not exist. Thus, the in-memory error correction code ECC_IN_MEMORY is not stored in the memory core 630. However, the data DATA' and the error correction code ECC' may be stored in the memory core 630. In the write operation, since the error correction operation is not performed, the data DATA and the data DATA' may be the same, and the error correction code ECC and the error correction code ECC' may be the same.

The memory core 630 may store the data DATA' and the error correction code ECC' in the memory device 320. The memory core 630 may include a plurality of cell arrays and circuits for writing the data DATA' and the error correction code ECC' in the plurality of cell arrays and reading the data DATA' and the error correction code ECC' from the plurality of cell arrays.

The in-memory error correction circuit 620 may correct an error of the data DATA' by using the error correction code ECC' read from the memory core 630. Since the in-memory error correction circuit 620 uses the same error correction code ECC' as the error correction circuit 312 of the memory controller 310, the in-memory error correction circuit 620 may be designed to have the same error correction capability as the error correction circuit 312. However, in this case, because an error correction time is markedly increased, it is difficult for the error correction operation of the memory device 320 to be performed in a hidden state. Therefore, the in-memory error correction circuit 620 may be designed to have lower error correction capability than the error correction circuit 312. Namely, when the error correction circuit 312 has error correction capability of maximum M bits, the in-memory error correction circuit 620 may be designed to have error correction capability of maximum N bits. Both N and M may be integers of 1 or more, and M>N. Further, the in-memory error correction circuit 620 may perform the error correction operation only in the case where a specific condition is met. For example, the in-memory error correction circuit 620 may perform the error correction operation only in the case where a detected error is between one bit and N bits inclusive, i.e., 1 bit≤detected error≤N bits. In the further explanation given below, it is assumed, as an example, that N is 1 and M is 16, that is, 1 symbol.

The in-memory error correction circuit 620 may check the presence of an error through performing a CRC calculation by using the CRC code of 16 bits in the error correction code ECC'. Then, after performing a parity calculation by using the simple parity code of 16 bits in the error correction code ECC', it may be confirmed that an error of one bit is present, in the case where the number of 1-bit errors, among 16 bits, is 1 as a result of the calculation. That is to say, (1) the presence of an error may be confirmed through the CRC calculation, and (2) it may be confirmed as a result of the parity calculation that the number of 1-bit errors is 1. In the case where both (1) and (2) are satisfied, the in-memory error correction circuit 620 may correct the error of one bit by using the CRC code. While it is described above that the CRC code is a CRC-16 code, since the CRC-16 code is also an SECDED (single error correction and dual error detection) code, the error of one bit may be corrected by using the CRC code. In the case where the number of 1-bit errors is 0 as a result of performing the parity calculation again after performing the correction operation as described above, it may be confirmed that the correction operation for the error of one bit was correctly performed. In the case where the number of 1-bit errors is not 0 as a result of performing the simple parity calculation again, after performing the correction operation for the error of one bit by using the CRC-16 code, since the assumption of an 1-bit error is wrong, the correction operation may be canceled, and the data DATA of 256 bits and the error correction code ECC of 32 bits may be outputted.

The data DATA and error correction code ECC in which an error is corrected or not corrected by the in-memory error correction circuit 620 may be transferred from the memory device 320 to the memory controller 310.

In the memory system 300 configured as shown in FIGS. 3 and 6, the in-memory error correction circuit 620 uses the same error correction code ECC as the error correction circuit 312. Only an error which is correctable by the in-memory error correction circuit 620 is corrected. Therefore, a problem of the error correction capability of the error correction circuit 312 becoming deteriorated by the malfunction of the in-memory error correction circuit 620 is avoided. Since most errors occurring in the memory system 300 are small errors such as 1-bit errors, they may be corrected by the in-memory error correction circuit 620. The error correction circuit 312 may correct large errors which occur infrequently.

Figure 7:
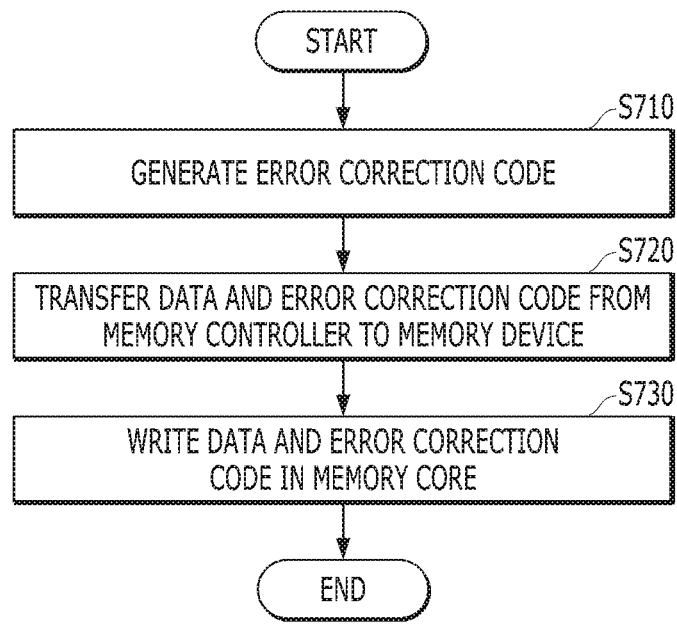
FIG. 7 is a flow chart describing a write operation of the memory system 300 configured as shown in FIGS. 3 and 6.

FIG. 7 is a flow chart describing a write operation of the memory system 300 configured as shown in FIGS. 3 and 6.

Referring to FIG. 7, the error correction code generation circuit 311 of the memory controller 310 may generate the error correction code ECC by using the data HOST_DATA transferred from the host (S710). The data HOST_DATA may be 256 bits, and the error correction code ECC may be 32 bits. 16 bits among the 32 bits of the error correction code ECC may be the CRC code, and the remaining 16 bits may be the simple parity code.

The memory controller 310 may transfer the data DATA and the error correction code ECC to the memory device 320 (S720). The memory device 320 may write the data DATA' and the error correction code ECC' in the memory core 630 (S730).

In the write operation, the error correction code ECC is generated in the memory controller 310, and the memory device 320 may store the data DATA and the error correction code ECC received therein.

Figure 8:
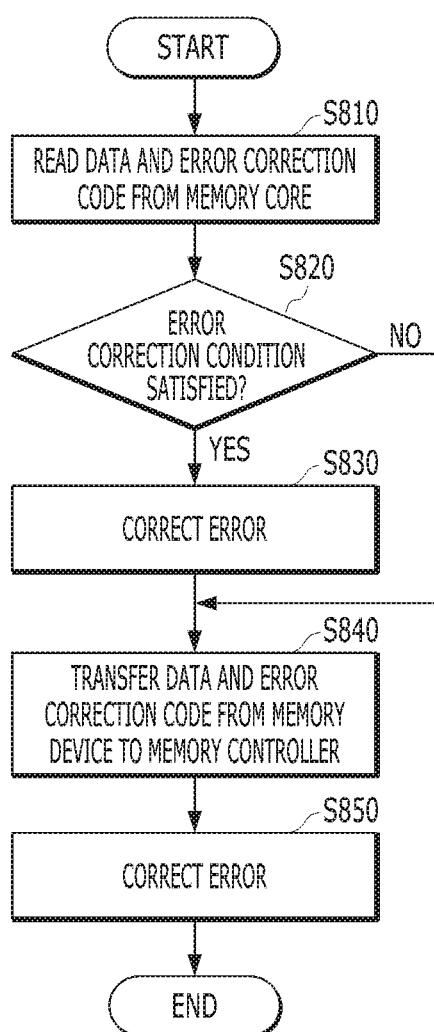
FIG. 8 is a flow chart describing a read operation of the memory system 300 configured as shown in FIGS. 3 and 6.

FIG. 8 is a flow chart describing a read operation of the memory system 300 configured as shown in FIGS. 3 and 6.

Referring to FIG. 8, the data DATA' and the error correction code ECC' may be read from the memory core 630 of the memory device 320 (S810).

The in-memory error correction circuit 620 of the memory device 320 may check whether an error correction condition is satisfied, by using the error correction code ECC' (S820). In other words, the in-memory error correction circuit 620 may check whether an error is one bit or not. The in-memory error correction circuit 620 may check (1) whether an error is present or not, through a CRC calculation, and may check (2) whether the number of 1-bit errors is 1, as a result of a parity calculation. In the case where both (1) and (2) are satisfied, the in-memory error correction circuit 620 may confirm that an error is one bit.

In the case where the error correction condition is satisfied (Y at the step S820), the in-memory error correction circuit 620 may correct an error of the data DATA' by using the error correction code ECC' (S830). In the case where the error correction condition is not satisfied (N at the step S820), the error correction operation at the step S830 may be skipped.

Thereafter, the data DATA and the error correction code ECC may be transferred from the memory device 320 to the memory controller 310 (S840).

Then, the error correction circuit 312 of the memory controller 310 may correct an error of the data DATA by using the error correction code ECC (S850). No error is present in the data DATA in most cases, and even when a small error is present in the data DATA, it is corrected at the step S830. Thus, a large error of the data DATA may be corrected at the step S850.

According to the embodiments, error correction efficiency in a memory system may be improved or enhanced.

Although various embodiments have been described and is illustrated, it will be apparent to those skilled in the art in light of the foregoing disclosure that various changes and modifications may be made without departing from the spirit and scope of the invention as defined in the following claims.

What is claimed is:

1. A memory system comprising:
   an error correction code generation circuit suitable for using write data to generate an error correction code to be stored together with the write data;
   a memory device suitable for, during a write operation, storing write data and the error correction code intact, which are received from the error correction code generation circuit, in a memory core, and, during a read operation, checking for an error in data read from the memory core, correcting the error in the read data using the error correction code and outputting the error-corrected read data and the error correction code, when the error in the read data is between one bit and N bits inclusive, where N is an integer of 1 or more, and outputting the read data and the error correction code when no error is present in the read data or the error in the read data exceeds N bits; and
   an error correction circuit suitable for correcting, when an error is present in the read data outputted from the memory device, the error in the read data using the error correction code outputted from the memory device,
   wherein the error correction circuit has error correction capability of M bits, where M is an integer greater than N, and
   the error correction code generation circuit and the error correction circuit are included in a memory controller which controls the memory device.

2. The memory system according to claim 1, wherein the write data and the error correction code stored in the memory core are an entire codeword corresponding to a write command transferred from the memory controller to the memory device.

3. The memory system according to claim 1, wherein the memory device comprises:
   the memory core suitable for storing the write data and the error correction code; and
   an in-memory error correction circuit suitable for checking for an error in the read data read from the memory core using the error correction code read from the memory core, and correcting the error in the read data using the error correction code only when the error in the read data is between one bit and N bits inclusive.

4. The memory system according to claim 1, wherein the memory device is a high bandwidth memory (HBM).

5. The memory system according to claim 1, wherein the error correction code includes a cyclic redundancy check (CRC) code and a simple parity code.

6. A method for operating a memory system including a memory controller and a memory device, the method comprising:
   generating, by the memory controller, using write data, an error correction code;
   transferring a write command, the write data, and the error correction code to the memory device from the memory controller;
   storing the write data and the error correction code in a memory core of the memory device;
   transferring a read command from the memory controller to the memory device;
   reading data and the error correction code from the memory core of the memory device;
   detecting, by the memory device, an error in the data read from the memory core using the error correction code read from the memory core;
   correcting, by the memory device, when the error in the read data is between one bit and N bits inclusive, where N is an integer of 1 or more, the error in the read data using the read error correction code, and transferring the error-corrected data and the read error correction code to the memory controller from the memory device;
   transferring, when no error is present in the read data or the error in the read data exceeds N bits, the read data and the read error correction code to the memory controller from the memory device; and
   correcting, by the memory controller, when an error is present in the read data transferred from the memory device, the error in the read data outputted using the error correction code transferred from the memory device,
   wherein the memory controller has error correction capability of M bits, where M is an integer greater than N.

7. The method according to claim 6, wherein the write data and the error correction code transferred to the memory device are an entire codeword corresponding to the write command transferred to the memory device.

8. The method according to claim 6, wherein the error correction code includes a cyclic redundancy check (CRC) code and a simple parity code.

9. The method according to claim 6, wherein the memory device is a high bandwidth memory (HBM).

10. A memory system comprising:
    a memory controller suitable for, during a write operation, generating an error correction code for correcting an error in data and transferring the error correction code to a memory device, and, during a read operation, correcting an error in the data stored in and transferred from the memory device, using the error correction code stored in and transferred from the memory device; and
    the memory device suitable for, during the write operation, storing the data and the error correction code transferred from the memory controller as they are, and, during the read operation, transferring the stored data and error correction code to the memory controller and, when a specific condition is satisfied, correcting an error in the stored data using the stored error correction code and transferring the error-corrected data and the used error correction code to the memory controller, wherein the specific condition is that the error in the stored data is between one bit and N bits inclusive, where N is an integer of 1 or more, and a maximum bit number of an error that is correctable by the memory controller using the error correction code transferred from the memory device is M bits, where M is an integer greater than N.

* * * * *